US008096462B2

United States Patent
Fong et al.

(10) Patent No.: US 8,096,462 B2
(45) Date of Patent: Jan. 17, 2012

(54) METHOD OF REWORKING ELECTRICAL SHORT IN ULTRA SONIC BONDER

(75) Inventors: Nia W. Fong, San Francisco, CA (US); Tack Loong Low, Singapore (SG)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 12/433,445

(22) Filed: Apr. 30, 2009

(65) Prior Publication Data

US 2010/0276472 A1    Nov. 4, 2010

(51) Int. Cl.
  *B23K 20/00* (2006.01)
  *B23K 37/00* (2006.01)
(52) U.S. Cl. ............................. 228/102; 228/4.5; 228/13
(58) Field of Classification Search .................. 228/102, 228/13, 12, 8, 9, 103, 180.5, 4.5; 257/E21.518
See application file for complete search history.

(56) References Cited

U.S. PATENT DOCUMENTS

| 4,187,972 | A  |   | 2/1980  | Vella |
| 5,059,769 | A  |   | 10/1991 | Fortune |
| 5,414,919 | A  | * | 5/1995  | Soto .............................. 29/33 R |
| 5,513,429 | A  | * | 5/1996  | Soto ................................ 29/840 |
| 6,572,001 | B2 | * | 6/2003  | Wong et al. .................... 228/4.5 |
| 7,458,496 | B2 | * | 12/2008 | Farassat ......................... 228/4.5 |
| 7,464,854 | B2 | * | 12/2008 | Babinetz .................... 228/180.5 |
| 7,699,209 | B2 | * | 4/2010  | Tei ................................. 228/102 |
| 2005/0279811 | A1 |  | 12/2005 | Bell |

* cited by examiner

*Primary Examiner* — Roy King
*Assistant Examiner* — Michael Aboagye
(74) *Attorney, Agent, or Firm* — Yee & Associates, P.C.; Steven L. Bennett

(57) ABSTRACT

A modified ultrasonic bonding machine and process uses a sharpened bonding wedge to perform cutting of short material. The sharpened wedge is controlled by the same position control device control used to position the bonding wedge for bonding. The software is modified to permit selection of bonding or cutting, and the bonding wedge is replaced with a cutting wedge. The modified ultrasonic bonding machine allows the operator to use the automated system of the machine to do the cutting, and the precision gained ensures that no damage to the parts is caused by the cutting process.

6 Claims, 10 Drawing Sheets

METHOD OF REWORKING ELECTRICAL SHORT IN ULTRA SONIC BONDER

BACKGROUND

1. Field

The disclosure relates generally to vibratory bonding and more specifically to computer control of a bonding machine to perform its normal bonding function, and also to perform rework by allowing an operator to use the remotely controlled three axis motion of the bonding machine to position a sharpened wedge over a bridge between bonds and to cut the bridge.

2. Description of the Related Art

Ultrasonic Bonding is a known process for fusing electrical connections through the application of pressure and ultrasonic energy. Ultrasonic Bonding is performed by machines that are both computer-controlled and operator controlled. The Ultrasonic bonding machine has electrical motors for movement in the x axis, the y axis and in the z axis. Software allows a part to be indexed for precise movement in response to a joystick controlled by an operator. The operator moves an ultrasonic wedge into position while viewing the circuit through a microscope. The joystick enables the user to precisely place a bonding wedge onto the wire to be bonded. A weight attached to a wedge holder applies downward pressure to the wedge ensuring contact between the wedge and the wire to be bonded. When the operator is ready to initiate the bonding process, the operator presses a button on the joystick in order to send ultrasonic energy through the bonding wedge and onto the wire. The ultrasonic energy creates the bond.

When bonds are made in close proximity to other bonds, material from one bond may contact a neighboring bond. Such contact is referred to as bridging, and the bridge between the two bonds causes a short and results in a failure of the part at a continuity test. Shorts caused by bridging must be repaired, and the repair process is referred to as reworking the bond. The current method to rework the bond is for the operator to manually cut the bridge of material connecting two bonds using a sharp blade. The operator cannot precisely control the movement of the blade and the precision is only as good as the motor reflexes of the operator. Moreover, because the circuits to which the bonds are being applied are very small, the operator views the bridge and the bonds joined by the bridge under a microscope. Since the dimensions are so small, accurate manual movement of the cutting instrument is very difficult. Damage to components of the part can easily arise due to imprecision arising from the operators vision and motor reflexes. Furthermore, the manual operation of physically cutting the bridge between two bonds is difficult and time consuming.

What is needed beyond the prior art is a way to automate the rework process to eliminate manual manipulation of a cutting tool by the operator.

SUMMARY

According to one embodiment, a modified ultrasonic bonding machine comprises a physical component and a software component. Together, the physical component and the software component modify an existing ultrasonic bonding machine so that the precision of the bonding process is adapted to the rework process, thereby eliminating a manual cutting of a bridge between bonds. The software component adapts computer control of the bonding machine to allow operator selection of bonding or cutting. In response to a selection of bonding or rework, an operation of a control on a position control device is changed from causing an ultrasonic bond to causing a cutting action. The physical component is a sharpened wedge that is inserted into a wedge arm of the cutting machine. In one embodiment, the sharpened wedge is manually placed after manual removal of the bonding wedge by the operator. In another embodiment, the bonding machine is adapted to have a rotatable wedge arm so that the computer can automatically rotate the selected wedge into position. In another embodiment, software creates a new function and flag in the source code of the ultrasonic bonder to give it the rework capability. The sharpened wedge cuts the bridge causing an electrical short in response to activation of the control by the operator.

DETAILED DESCRIPTION

Figure 1:
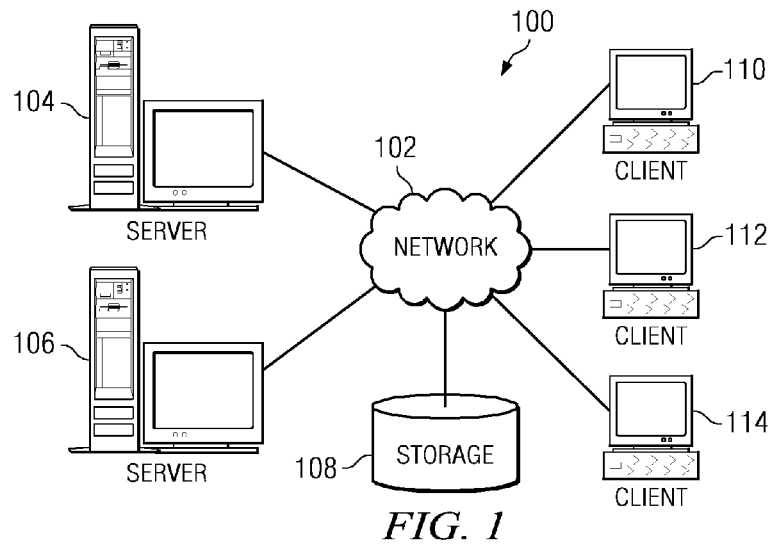
FIG. 1 is an exemplary server-client computer system.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
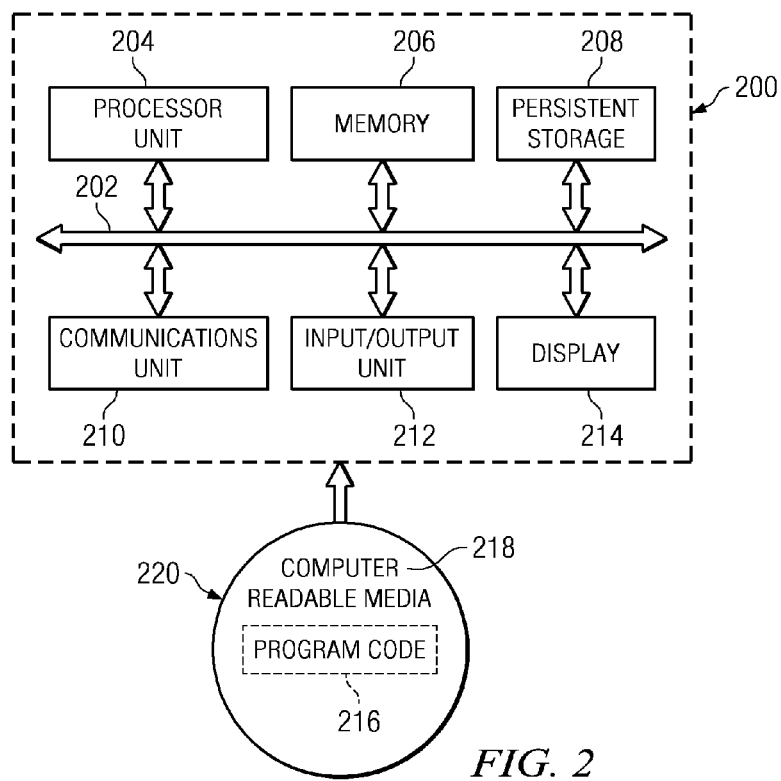
FIG. 2 is an exemplary computer framework.

With reference now to the figures, and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 is a pictorial representation of a network of a data processing system in which illustrative embodiments may be implemented. Network data processing system 100 is a network of computers in which the illustrative embodiments may be implemented. Network data processing system 100 contains network 102, which is the medium used to provide communication links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

Program code located in network data processing system 100 may be stored on a computer recordable storage medium and downloaded to a data processing system or other device for use. For example, program code may be stored on a computer readable storage medium on server 104 and downloaded to client 110 over network 102 for use on client 110.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

With reference now to FIG. 2, a block diagram of a data processing system is shown in which illustrative embodiments may be implemented. Data processing system 200 is an example of a computer, such as server 104 or client 110 in FIG. 1, in which computer-usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multiprocessor core, depending on the particular implementation.

Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices. A storage device is any piece of hardware that is capable of storing information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer-usable program code, or computer-readable program code that may be read and executed by a processor in processor unit 204. The program code in the different embodiments may be embodied on different physical or tangible computer-readable media, such as memory 206 or persistent storage 208.

Program code 216 is located in a functional form on computer readable media 218 that is selectively removable and may be loaded onto or transferred to data processing system 200 for execution by processor unit 204. Program code 216 and computer-readable media 218 form computer program product 220 in these examples. In one example, computer-readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer-readable media 218 also may take the form of a persistent storage, such as a hard drive, a thumb drive, or a flash memory that is connected to data processing system 200. The tangible form of computer-readable media 218 is also referred to as computer-recordable storage media. In some instances, computer-recordable media 218 may not be removable.

Alternatively, program code 216 may be transferred to data processing system 200 from computer-readable media 218 through a communications link to communications unit 210 and/or through a connection to input/output unit 212. The communications link and/or the connection may be physical or wireless in the illustrative examples. The computer-readable media also may take the form of non-tangible media, such as communications links or wireless transmissions containing the program code.

In some illustrative embodiments, program code 216 may be downloaded over a network to persistent storage 208 from another device or data processing system for use within data processing system 200. For instance, program code stored in a computer readable storage medium in a server data processing system may be downloaded over a network from the server to data processing system 200. The data processing system providing program code 216 may be a server computer, a client computer, or some other device capable of storing and transmitting program code 216.

The different components illustrated for data processing system 200 are not meant to provide architectural limitations to the manner in which different embodiments may be implemented. The different illustrative embodiments may be implemented in a data processing system including components in addition to, or in place of, those illustrated for data processing system 200. Other components shown in FIG. 2 can be varied from the illustrative examples shown.

The different embodiments may be implemented using any hardware device or system capable of executing program code. As one example, the data processing system may include inorganic components integrated with organic components and/or may be comprised entirely of organic components excluding a human being. For example, a storage device may be comprised of an organic semiconductor. As another example, a storage device in data processing system 200 is any hardware apparatus that may store data. Memory 206, persistent storage 208, and computer-readable media 218 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache, such as found in an interface and memory controller hub that may be present in communications fabric 202.

Figure 3:
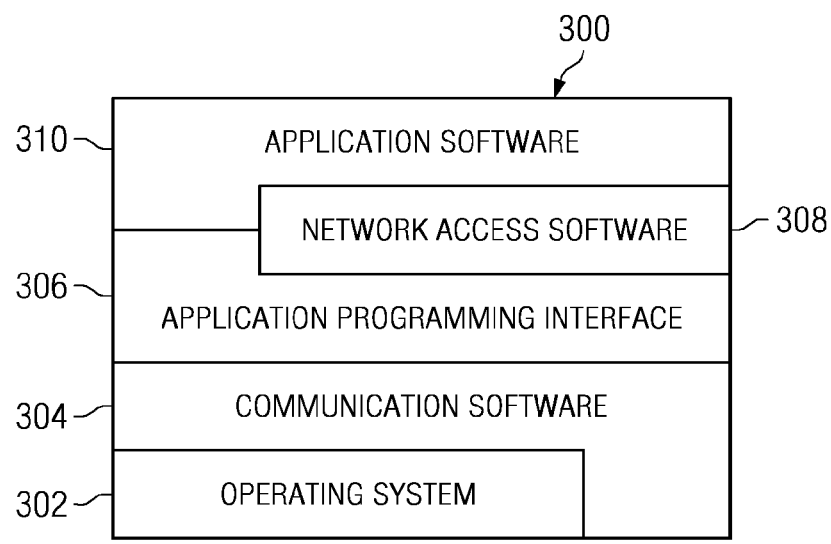
FIG. 3 is an exemplary software architecture for a server-client system containing application software.

Turning to FIG. 3, typical software architecture 300 for a server-client system is depicted in accordance with an illustrative embodiment. At the lowest level, operating system 302 is utilized to provide high-level functionality to the user and to other software. Such an operating system typically includes a basic input/output system (BIOS). Communication software 304 provides communications through an external port to a network, such as the Internet, via a physical communications link by either directly invoking operating system functionality or indirectly bypassing the operating system to access the hardware for communications over the network.

Application programming interface (API) 306 allows the user of the system, such as an individual or a software routine, to invoke system capabilities using a standard consistent interface without concern for how the particular functionality is implemented. Network access software 308 represents any software available for allowing the system to access a network. This access may be to a network, such as a local area network (LAN), wide area network (WAN), or the Internet. With the Internet, this software may include programs, such as Web browsers. Application software 310 represents any number of software applications designed to react to data through the communications port to provide the desired functionality the user seeks. Applications at this level may include those necessary to handle data, video, graphics, photos or text, which can be accessed by users of the Internet. The mechanism of modified bonding machine control software 800 (see FIG. 4 and FIG. 8) may be implemented within communications software 304 in these examples.

Figure 4:
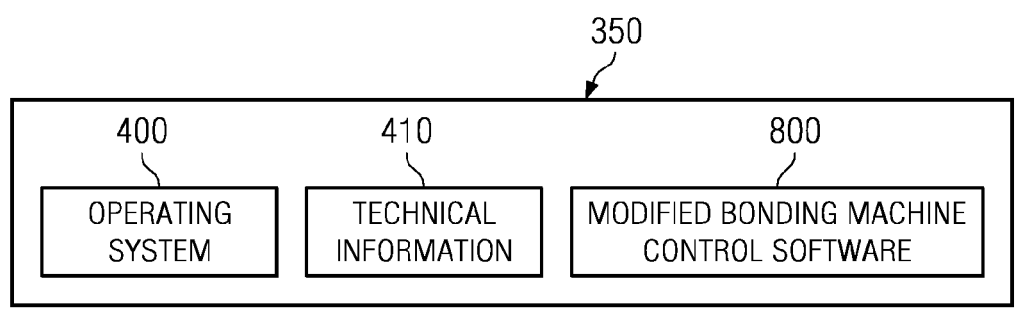
FIG. 4 is a memory containing elements of the application software.

FIG. 4 is an exemplary memory or storage 350 containing operating system 400, technical information 410, and modified bonding machine control software 800.

Figure 5A:
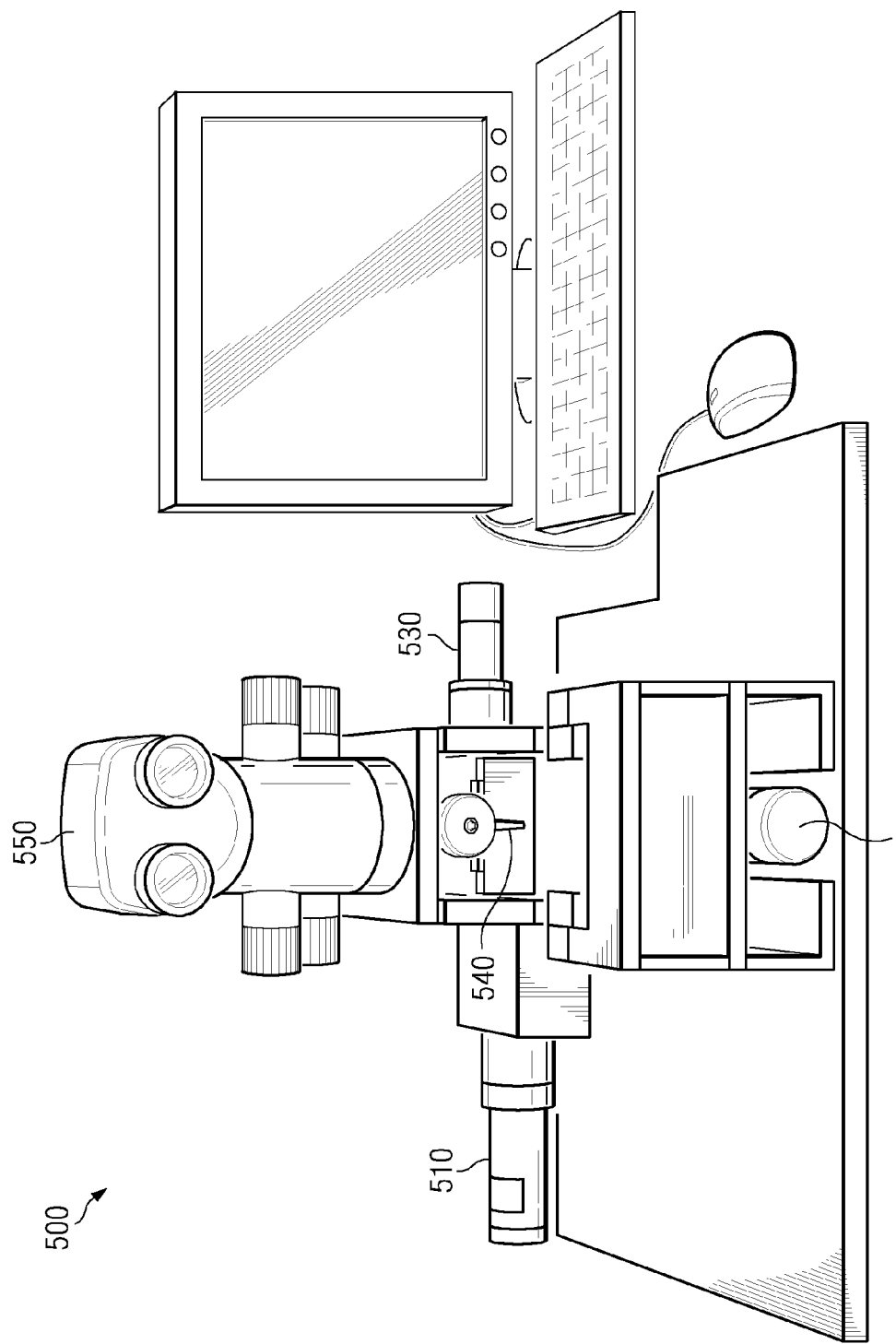
FIG. 5A is a front perspective view of an ultrasonic bonding machine.

FIG. 5A is bonding machine 500 having x axis motor 510, y axis motor 520, and z axis motor 530. Wedge holder 540 is seen beneath microscope 550 in a downward pointing position. Wedge holder 540 is capable of rotation vertically about the x axis as is further shown in FIG. 5B. X axis motor 510, y axis motor 520, and z axis motor 530 comprise a motion system. Persons skilled in the art are aware that multiple motion systems are available to provide movement of the wedge holder in three dimensions. Persons skilled in the art are further aware that bonding machine 500 can be controlled by a position control device which may be a computer such as client computers 110, 112 and 114 and server computers 104 and 106 in FIG. 1 or the data processing system of FIG. 2. For example, referring to FIG. 2, input/output unit may communicate with processor 204 in response to inputs from a variety of input devices such as a keyboard (not shown), a mouse, See FIG. 5A, or a joystick (not shown) in order to control the motion system of bonding machine 500.

Figure 5B:
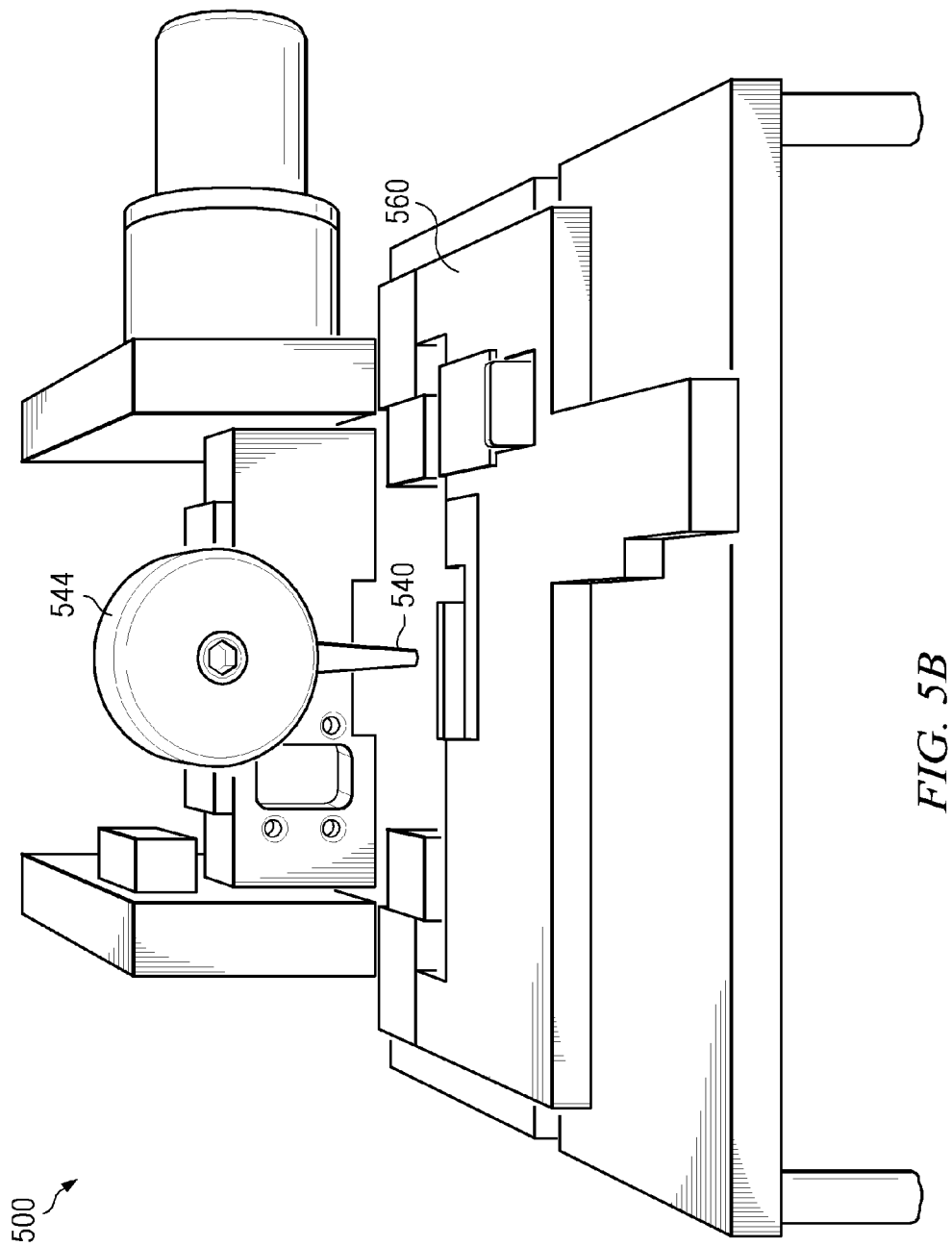
FIG. 5B is a front perspective close up of the wedge holder and weight of the ultrasonic bonding machine positioned above a part held in a transfer tool.

FIG. 5B is wedge holder 540, pointing downward in a vertical plane, and weight 544. Transfer tool 560 for holding parts to be bonded lies in a horizontal plane beneath wedge holder 540.

Figure 5C:
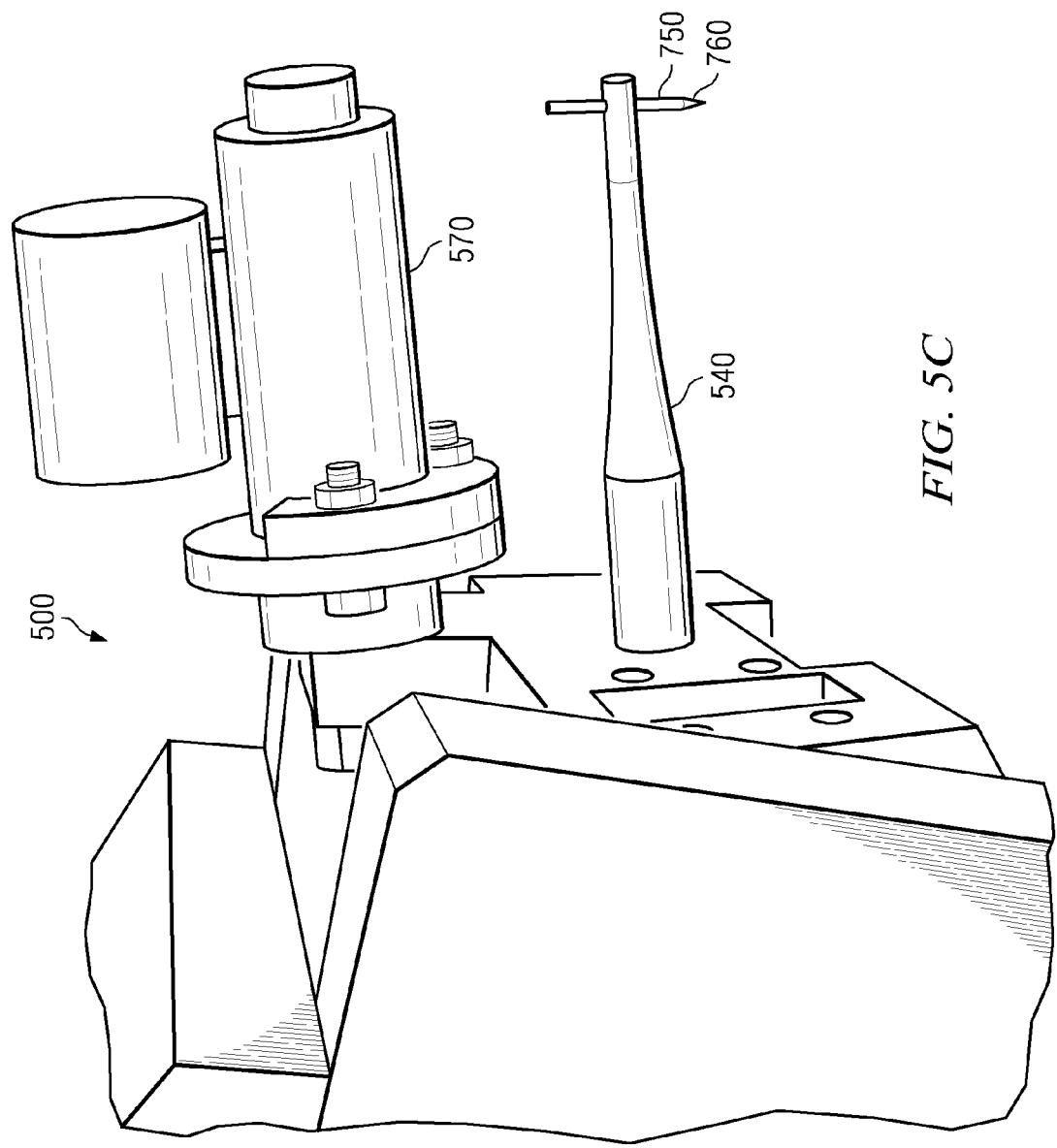
FIG. 5C is a side view of the bonding machine wedge holder and wedge.

FIG. 5C is a partial side view of bonding machine 500, wedge holder 540, modified weight 570, and sharpened wedge 750 having sharp end 760. FIG. 5C shows that weight 544 can be configured to attach at a different location and to have a different shape such as modified weight 570. Persons skilled in the art recognize that weight 544 and modified weight 570 are only two configurations, and that many different configurations can also perform the function of applying weight to the bonding and/or cutting operations of bonding machine 500. Furthermore, in FIG. 5C, wedge holder 540 has rotated from a substantially downward pointing position in a vertical plane, to an elevated position substantially above a horizontal plane.

Figure 5D:
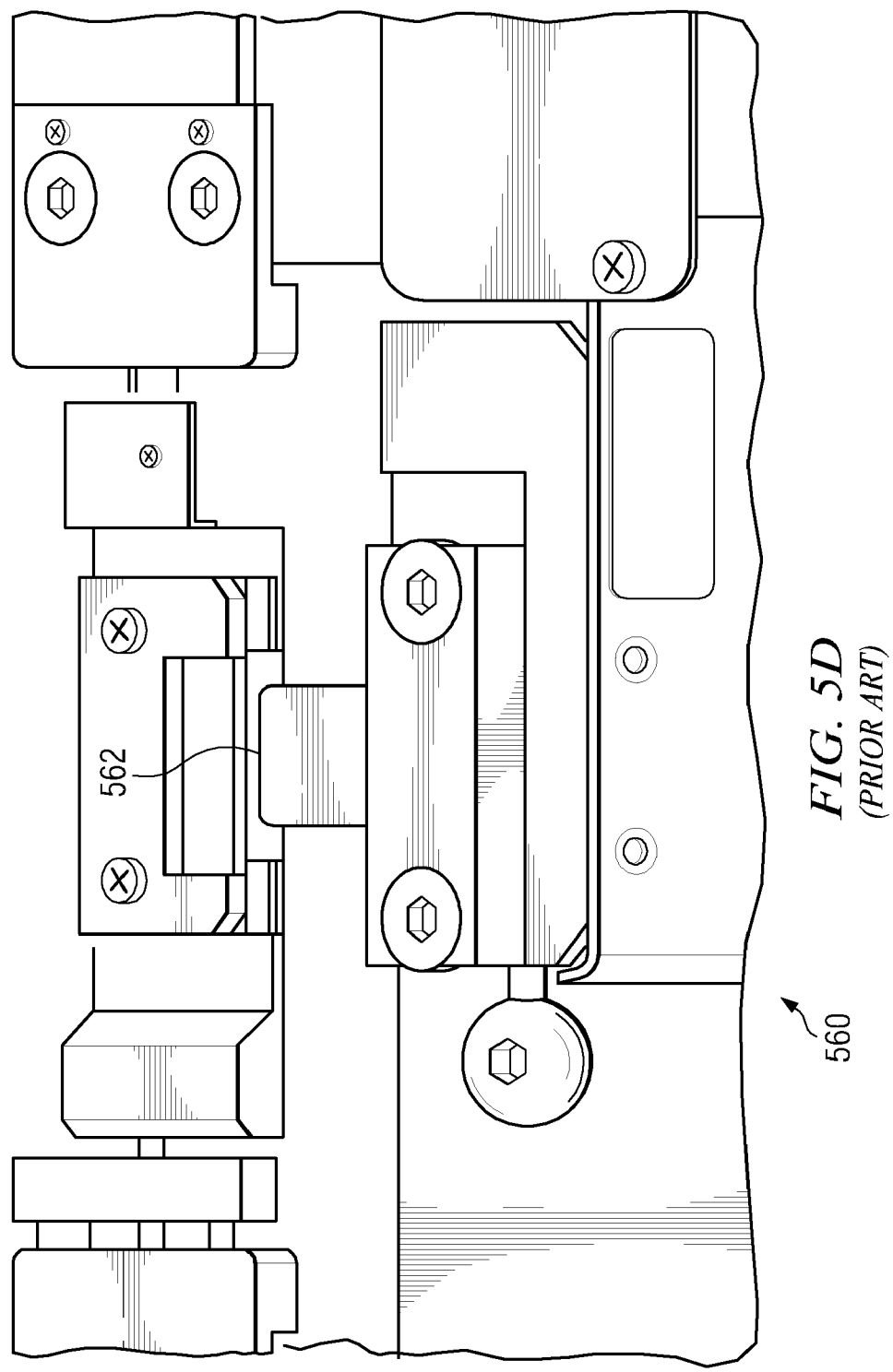
FIG. 5D is a part situated in a transfer tool.

FIG. 5D is transfer tool 560 with part 562 positioned within transfer tool 560.

Figure 6B:
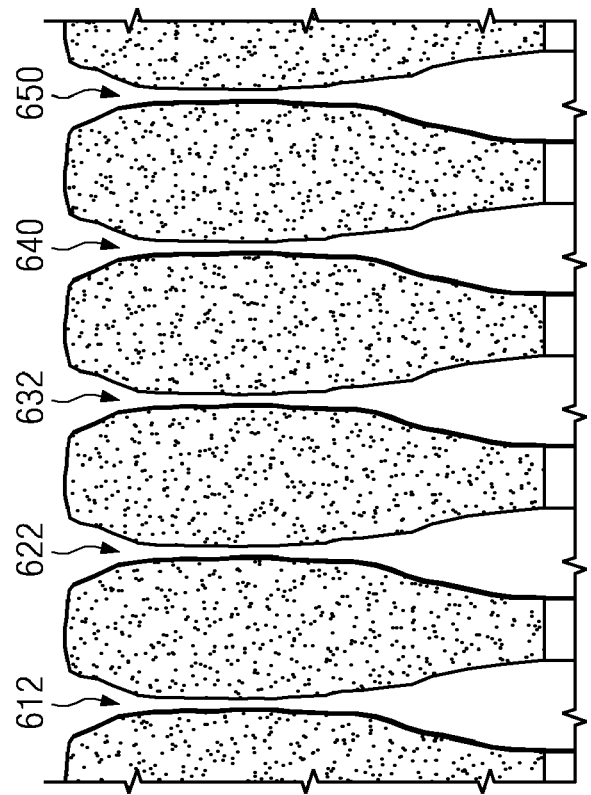
FIG. 6B is a plurality of reworked bonds with shorting material cut away.
Figure 6A:
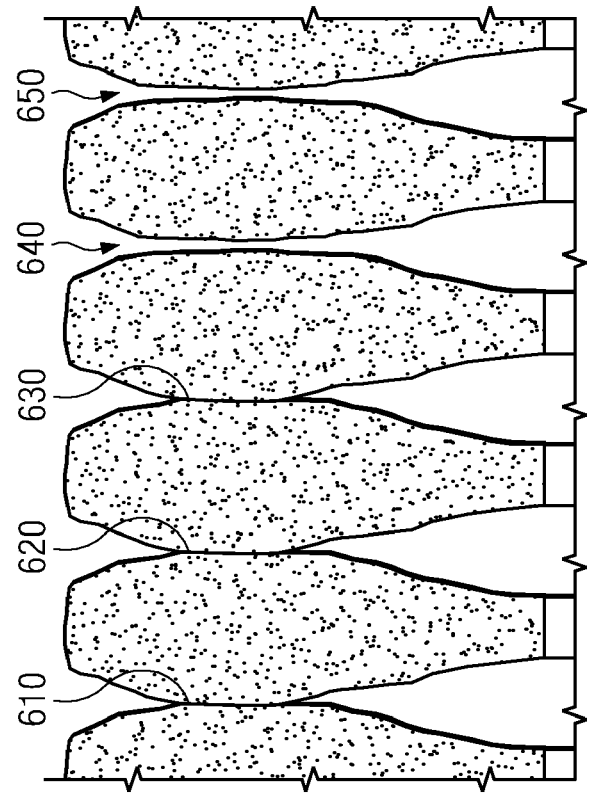
FIG. 6A is a plurality of wire bonds with shorting.

FIG. 6A is a plurality of wire bonds with shorting. Specifically, FIG. 6A shows six bonds with first short 610, second short 620, and third short 630. Spaces 640 and 650 do not have contiguous sections of adjacent wire bonds and, therefore, do not create a short.

FIG. 6B is the plurality of bonds of FIG. 6A with the shorts removed by cutting at first rework 612, second rework 622, and third rework 632. Each of first rework 612, second rework 622, and third rework 632 have had shorting material cut away by modified bonding machine control software 800 (see FIG. 8) and sharpened bonding wedge 750 having cutting edge 760 (see FIG. 7B).

Figure 7B:
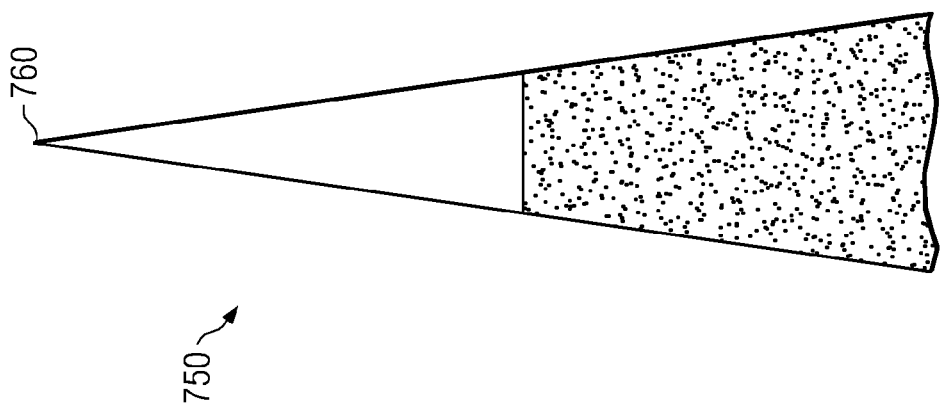
FIG. 7B is an ultrasonic wedge sharpened for use as a cutter in an automated rework system.
Figure 7A:
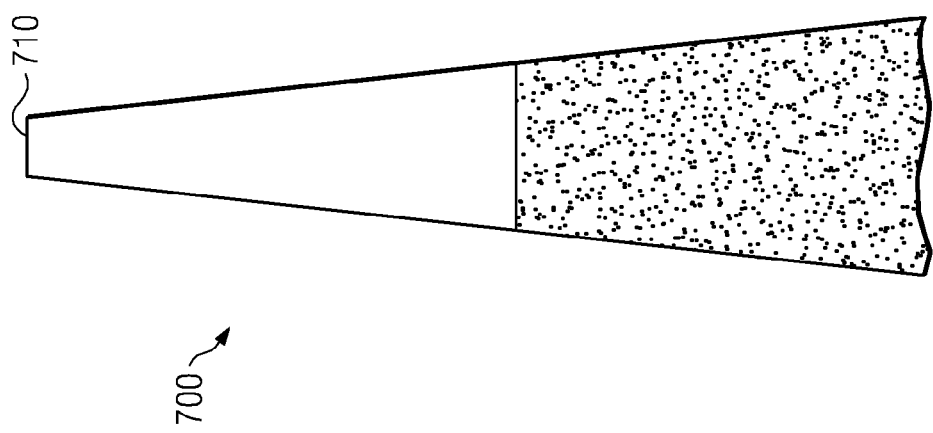
FIG. 7A is a prior art wedge used by the ultrasonic bonding machine.

FIG. 7A is bonding wedge 700 used by the ultrasonic bonding machine. As can be seen bonding wedge 700 tapers to end 710 which has a rounded or flattened surface where pressure is applied to the bond during the ultrasonic bonding process.

FIG. 7B is sharpened bonding wedge 750 which has been sharpened to create cutting edge 760 for use as a cutting tool in conjunction with modified bonding machine control software 800 that controls bonding machine 500.

Figure 8:
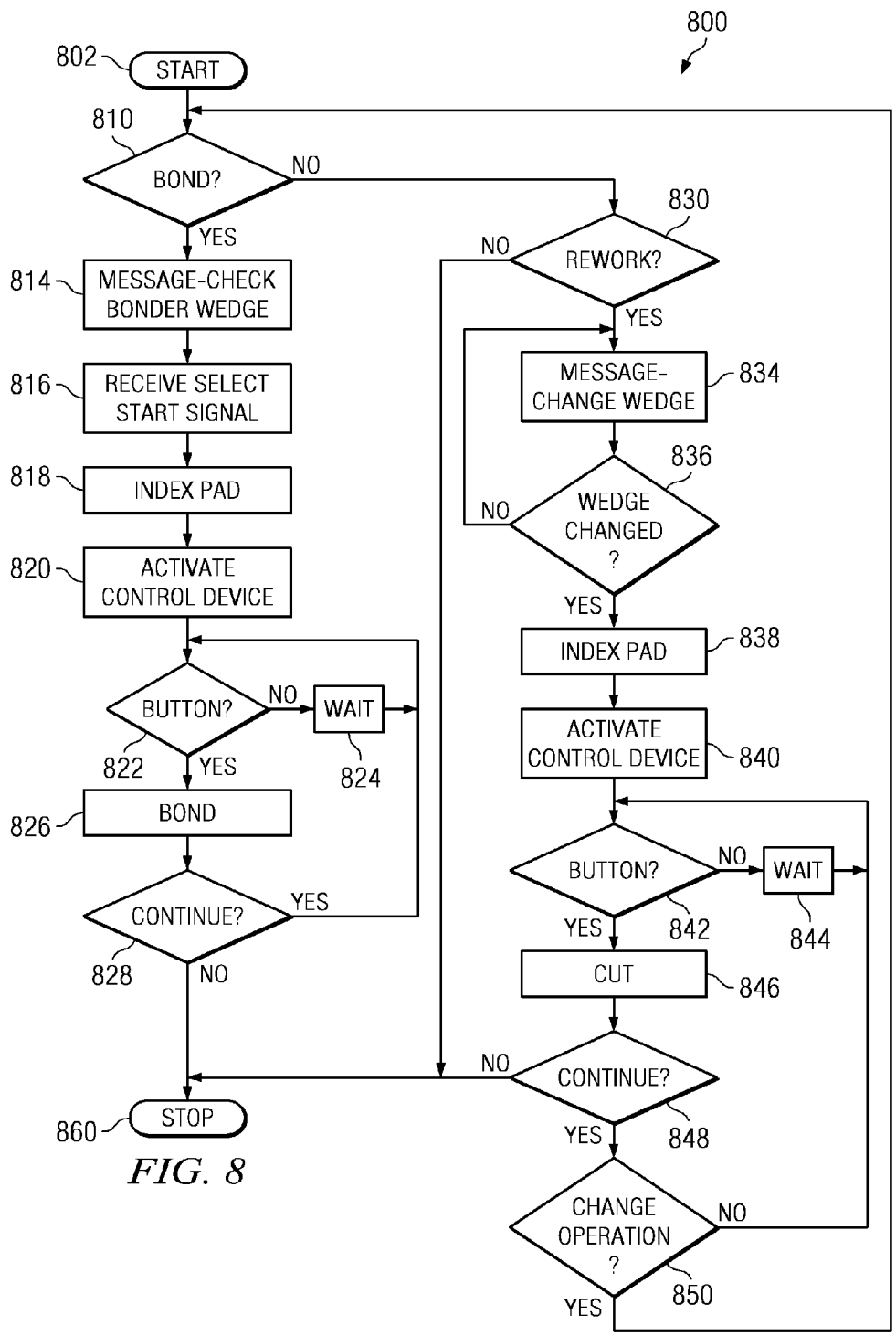
FIG. 8 is a flowchart of the bonding machine control software modified to perform both bonding and automated rework.

FIG. 8 is a flowchart of modified bonding machine control software 800 for performing both bonding and automated rework. Modified bonding machine control software 800 starts (step 802) and determines whether a select bonding signal has been received (step 810). If so, modified bonding machine control software 800 displays a message to the operator (step 814) reminding the operator to check the bonder wedge. Responsive to receiving a start signal 816, modified bonding machine control software 800 indexes the pad (step 818) and activates the position control device (step 820). Responsive to an activation of a control on an input device of the position control device (step 822), bonding is performed (step 826). If the control is not activated, then modified bonding machine control software 800 waits (step 824) and goes to step 822. Modified bonding machine control software 800 determines whether to continue (step 828) and if so, goes to step 822, and if not, stops (step 860).

When modified bonding machine control software 800 determines that bonding is not to be performed, it determines whether rework is to be performed by receiving a select rework signal (step 830). Modified bonding machine control software 800 displays a message reminding the operator to change the bonding wedge (step 834) to a sharpened wedge (step 836), and responsive to determining that the bonding wedge has been changed to a sharpened wedge (step 836), indexes the pad (step 838) and activates the position control device (step 840). Responsive to activation of the control on the input device of the position control device (step 842), modified bonding machine control software 800 cuts short material using sharpened wedge 750 (step 846). If the control on the input device of the position control device is not activated, modified bonding machine control software 800 waits (step 844) and goes to step 842. If the operator wants to continue (step 848), modified bonding machine control software 800 determines whether the operator wants to change operation to bonding (step 850), and if so, goes to step 810. In one embodiment, the sharpened wedge is manually placed after manual removal of the bonding wedge by the operator. In another embodiment, the bonding machine is adapted to have a rotatable wedge arm so that the computer can automatically rotate the selected wedge into position. In another embodiment, software creates a new function and flags in the source code of the ultrasonic bonder to give it the rework capability. The new function is called OnCutShort and the new flag is called m_pshortflag. The new function and the new flag are introduced to enable the bonding machine to rework the electrical short in addition to bonding. OnCutShort function instructs the motion system to go to the prescribed position and perform cutting action on the electrical short. With the m_pshortflag, the bonder has the means of alternating between bonding mode and rework mode. The sharpened wedge cuts the bridge causing an electrical short in response to activation of the control by the operator.

Figure 9:
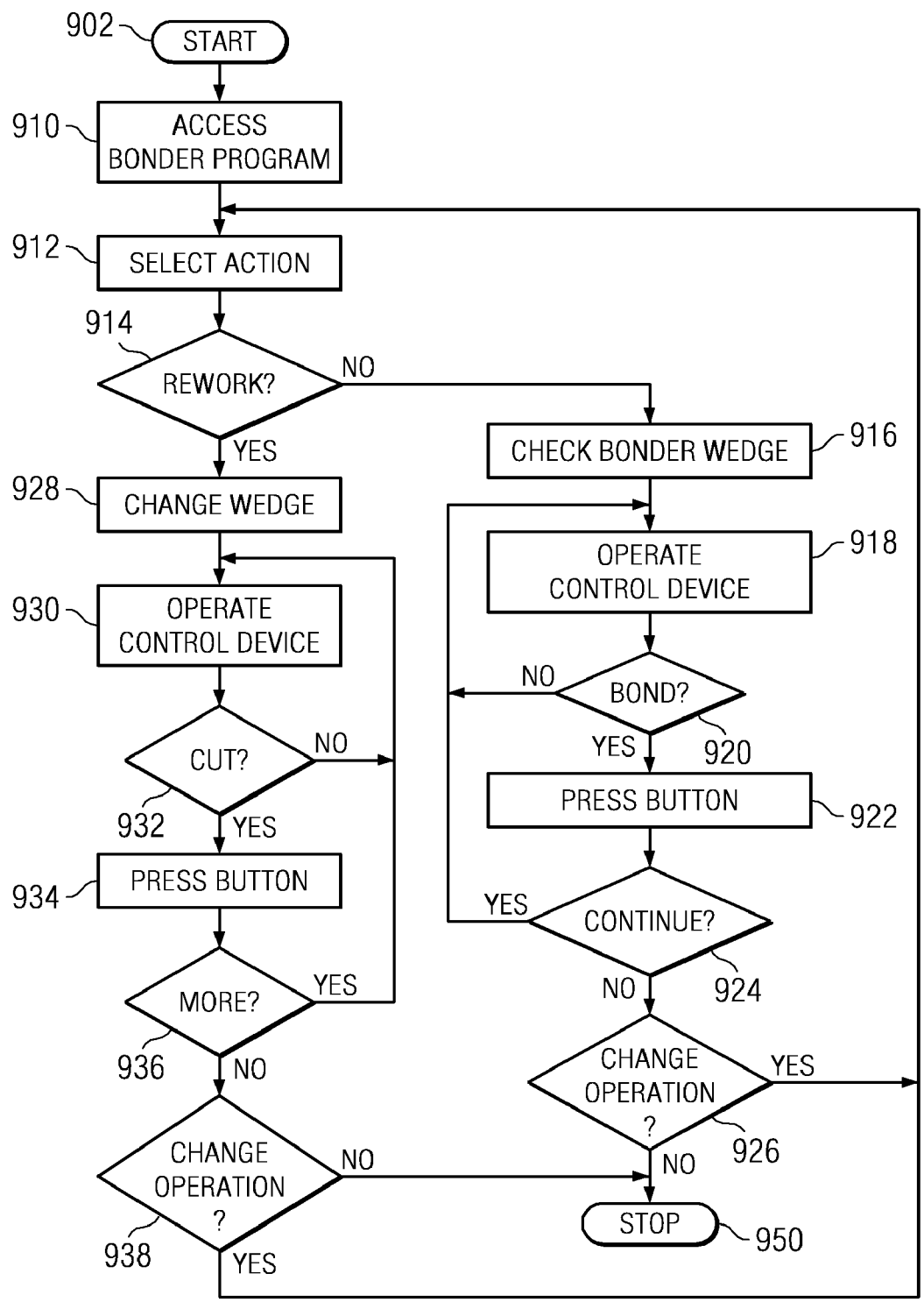
FIG. 9 is a flowchart of the operator process using the modified bonding machine to both bond and automated rework.

FIG. 9 is a flow chart of the operator process using the modified bonding machine to both bond and automated rework. Operator process 900 starts (step 902) and the operator accesses modified bonding machine control software 800 (step 910). The operator selects an action (step 912). If the operator does not select rework, the operator checks the bonder wedge (step 916), operates the input device of the position control device (step 918) and when ready to bond (step 920) activates the control on the input device of the position control device (step 922). If the operator wants to continue (step 924), the operator goes to step 918. If the operator does not want to continue (step 924), the operator decides whether to change operation (step 926), and if so, goes to step 912. If not, operator process 900 ends (step 950).

When the operator decides to rework (step 914), the operator changes the bonding wedge to the sharpened wedge (step 928). The operator operates the input device of the position control device (step 930) to position the sharpened wedge (step 928), and when ready to cut (step 932), activates the control on the input device of the position control device (step 934). If more operations are desired (step 936), operator process goes to step 930, and if a change in operation is not required (step 938), ends (step 950).

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer-implemented method for performing a bonding operation and a rework operation using an ultrasonic bonding machine, the computer implemented method comprising:
    introducing a function and a flag into a source code of the ultrasonic bonding machine that enables the ultrasonic bonding machine to perform the rework operation, wherein the function instructs a motion system to go to a prescribed position and cut a bridge, and wherein the flag allows the ultrasonic bonding machine to alternate between the bonding operation and the rework operation;
    responsive to a selection of the rework operation on a display connected to a computer, determining that a sharpened wedge is operably coupled to a wedge holder of the ultrasonic bonding machine;
    responsive to determining that the sharpened wedge is in the wedge holder, moving the wedge holder in at least one lateral movement so that the sharpened wedge is positioned over a bridge causing a short between a pair of bonds;
    responsive to moving the wedge holder in the at least one lateral movement so that the sharpened wedge is positioned above the bridge causing the short between the pair of bonds, activating a control on a position control device connected to the computer and to the ultrasonic bonding machine; and
    responsive to an activation of the control, moving the wedge holder downward so that the sharpened wedge cuts the bridge.

2. The computer-implemented method of claim 1, further comprising:
    loading a program into a memory connected to a computer, the program containing instructions configured to move the wedge holder in three dimensions and to switch the ultrasonic bonding machine from the bonding operation to the rework operation in response to the selection of the rework operation.

3. The computer-implemented method of claim 1, further comprising:
    switching the ultrasonic bonding machine from the bonding operation to the rework operation by rotating a wedge arm from a bonding wedge-position to a sharpened wedge position.

4. A computer program product for causing an ultrasonic bonding machine to perform a bonding operation and a cutting operation on the ultrasonic bonding machine, the computer program product comprising:
    a computer readable tangible storage device, the computer readable tangible storage device containing a plurality of instructions, the plurality of instructions configured to cause a computer connected to a bonding machine and to a position control device to perform steps comprising:
    introducing a function and a flag into a source code of the ultrasonic bonding machine that enables the ultrasonic bonding machine to perform a rework operation, wherein the function instructs a motion system to go to a prescribed position and cut a bridge, and wherein the flag allows the ultrasonic bonding machine to alternate between the bonding operation and the rework operation;
    responsive to a selection of the rework operation on a display connected to the computer, determining that a wedge holder of the ultrasonic bonding machine is operably coupled to a sharpened wedge;
    responsive to determining that the sharpened wedge is operably coupled to the wedge holder, moving the wedge holder in at least one lateral movement so that the sharpened wedge is positioned over a bridge causing a short between a pair of bonds;
    responsive to moving the wedge holder in the at least one lateral movement so that the sharpened wedge is positioned above the bridge causing the short between the pair of bonds, activating a control on a position control device; and
    responsive to an activation of the control on the position control device, cutting, by the sharpened wedge, the bridge.

5. The computer program product of claim 4, wherein the plurality of instructions are further configured to cause the computer to move the wedge holder in three dimensions and, responsive to the selection of the rework operation on the display, switch the ultrasonic bonding machine from the bonding operation to the rework operation.

6. The computer program product of claim 4, wherein the plurality of instructions are further configured to cause the computer to switch the ultrasonic bonding machine from the bonding operation to the rework operation by rotating a wedge arm from a bonding wedge position to a sharpened wedge position.

* * * * *